(12) United States Patent
Xu

(10) Patent No.: US 12,461,416 B2
(45) Date of Patent: Nov. 4, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Zuoyuan Xu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/815,759

(22) Filed: Aug. 26, 2024

(65) Prior Publication Data

US 2024/0419041 A1    Dec. 19, 2024

Related U.S. Application Data

(63) Continuation of application No. 17/754,942, filed as application No. PCT/CN2022/080622 on Mar. 14, 2022, now Pat. No. 12,117,700.

(30) Foreign Application Priority Data

Mar. 7, 2022  (CN) .......................... 202210215254.X

(51) Int. Cl.
*G02F 1/1345*    (2006.01)
(52) U.S. Cl.
CPC ............................... *G02F 1/13452* (2013.01)

(58) Field of Classification Search
CPC ...................................... G02F 1/13452–13458
See application file for complete search history.

(56) References Cited

U.S. PATENT DOCUMENTS

2020/0175917 A1* 6/2020 Jo ...................... H10K 59/1315
2022/0181424 A1* 6/2022 Im ........................ H10K 59/131

FOREIGN PATENT DOCUMENTS

| CN | 105867035 A | * | 8/2016 | ....... G02F 1/136227 |
| CN | 113867058 B | * | 8/2024 | ............. H10D 86/60 |
| WO | WO-2019037529 A1 | * | 2/2019 | ........... G02F 1/1345 |

* cited by examiner

*Primary Examiner* — Mariceli Santiago
(74) *Attorney, Agent, or Firm* — PV IP PC; Wei Te Chung

(57) ABSTRACT

Embodiments of the present disclosure are directed to a display panel and a display device. The first fan-out wire in a first area is designed as a first portion of the first metallic layer and a second portion of a second metallic layer. The first portion of the first metallic layer is coupled to the second portion of the second metallic layer. The width of the first fan-out wire in the first area is less than the width of the fan-out wires in other areas. The distance between the first fan-out wires in the first area is less than the distance between the first fan-out wires in the other areas. While the impedance of the first fan-out wire is not increased or even reduced, the space occupied by the first fan-out wire is reduced.

20 Claims, 6 Drawing Sheets

DISPLAY PANEL AND DISPLAY DEVICE

CROSS-REFERENCE TO RELATED APPLICATIONS

This application is a continuation application of U.S. application Ser. No. 17/754,942, filed on Apr. 15, 2022, which is a National Phase of PCT Patent Application No. PCT/CN2022/080622 having international filing date of Mar. 14, 2022, which claims the priority of Chinese Application No. 202210215254.X filed with the Chinese Patent Office on Mar. 7, 2022 and titled "DISPLAY PANEL AND DISPLAY DEVICE", which is incorporated herein by reference in its entirety.

FIELD OF THE DISCLOSURE

The present disclosure relates to a display technology, and more particularly, to a display panel and a display device.

BACKGROUND

A routing extends from a display area to a fan-out region to couple the routing to a terminal to further couple the display panel to a driving chip to drive the display panel in a display device of the related art. Specifically, a fan-out wire will be designed with different film layers in the related art. Because of different metallic film layers with different impedances, the impedances of the fan-out wires in different layers are different in the related art. To deal with the problem as mentioned above, the width of the fan-out wire in the first metallic layer is widened in the display device of the related art to make the impedance of the fan-out wire in the first metallic layer and the second metallic layer similar or even equal and to improve the uniformity of the display device. However, this design can result in a large space for the fan-out wire of the first metallic layer, resulting in a larger bezel of the display panel. However, the fan-out wire in the first metallic layer may occupy a larger space and the bezel of the display panel 2 is widened based on the design of the related art.

Accordingly, the display device of the related art has a problem that the fan-out wire of a first metallic layer needs greater space actually.

SUMMARY

Technical Problem

An object of the present disclosure is to propose a new display panel and a new display device to deal with a technical problem that the size of a bezel of a display panel of the related art is greater because a fan-out wire of a first metallic layer needs greater space in a display device of the related art.

Technical Solution

According to an embodiment of the present disclosure, a display panel is disclosed.

The display panel includes a display area and a fan-out region, arranged at a side of the display area.

The fan-out region comprising a fan-out wire coupled to a bonding terminal and a bonding terminal arranged in the fan-out region. The display panel comprises a first metallic layer and a second metallic layer. An impedance of the first metallic layer is greater than the impedance of the second metallic layer.

The fan-out wire comprises a first fan-out wire and a second fan-out wire. One or more portions of the first fan-out wire are disposed at the first metallic layer. The second fan-out wire is disposed at the second metallic layer. In a first area that where the first fan-out wire exceeds the second fan-out wire, portions of the first fan-out wire comprise a first portion arranged at the first metallic layer and a second portion disposed at the second metallic layer and coupled to the first portion. A width of one or more of the first fan-out wires arranged at the first area is less than a width of the first fan-out wire arranged at other areas. A distance between the first fan-out wires in the first area is less than the distance between the first fan-out wires in the other areas.

In some embodiments, the first portion comprises one or more first coupling section and second coupling section. A terminal of the first coupling section is coupled to the routing of the display area. A terminal of the second coupling section is coupled to the bonding terminal. One or more of the first coupling section and the second coupling section are coupled to the second portion.

In some embodiments, another terminal of the first coupling section is coupled to a terminal of the second portion; another terminal of the second coupling section is coupled to another terminal of the second portion.

In some embodiments, the first portion further comprises a third coupling section; two terminals of the third coupling section are coupled to the first coupling section and the second coupling section, respectively. The third coupling section and the second portion are arranged in parallel.

In some embodiments, the length of the third coupling section is greater than or equal to the length of the second coupling section.

In some embodiments, the first fan-out wire comprises a first fan-out wire and a second fan-out wire. The first sub-routing is disposed adjacent to the second sub-routing; the first sub-routing comprises a first portion and a second portion. The second sub-routing comprises a first portion and a second portion. A projection of one or more of the first portions of the first sub-routing overlaps a projection of one or more of the second portion in the second sub-routing. The projection of one or more of the second portions of the first sub-routing overlaps the projection of one or more of the first portions of the second portion in the second sub-routing.

In some embodiments, the first portion of the first sub-routing comprises a fourth coupling section and a fifth coupling section. One terminal of the second portion of the first sub-routing is coupled to the fourth coupling section. Another terminal of the second portion of the first sub-routing is coupled to the fifth coupling section.

The first portion of the second sub-routing comprises a sixth coupling section and a seventh coupling section. One terminal of the second portion of the second sub-routing is coupled to the sixth coupling section. Another terminal of the second portion of the second sub-routing is coupled to the seventh coupling section.

The fourth coupling section overlaps the second portion of the second sub-routing partially, the seventh coupling section overlaps the second portion of the first sub-routing partially.

In some embodiments, a second area where the first fan-out wire and the second fan-out wire overlap. The width of each of the first fan-out wires is equal and the width of the second fan-out wires is equal. The width of the first fan-out wire is greater than the width of the second fan-out wire.

In some embodiments, the width of the first fan-out wire in the first area is less than the width of the first fan-out wire in the second area.

In some embodiments, the second area is an area where the first fan-out wire and the second fan-out wire overlap. The width of one or more of the first fan-out wires gradually increases in a direction from a middle area toward two sides of the fan-out region.

In some embodiments, the width of the first fan-out wire in the first area is less than the width of the first fan-out wire in the second area and is closest to the width of the first fan-out wire of the first area.

In some embodiments, the width of the first fan-out wire in the first area is greater than or equal to the width of the first fan-out wire in the second area and is closest to the width of the first fan-out wire of the first area. The distance between the first fan-out wires of the first area is less than the distance between the first fan-out wires in the other areas.

In some embodiments, the distance between one or more of the first sub-routings gradually increases in the direction of the middle area of the first sub-routing toward two sides of the fan-out region.

In some embodiments, the distance between the first fan-out wires in the first area is less than the minimum distance between the first fan-out wires in the second area.

In some embodiments, the distance between the first fan-out wires in the first area is greater than or equal to the distance between the first fan-out wires in the other areas.

According to an embodiment of the present disclosure, a display device is disclosed.

The display device includes a driving chip and a display panel.

The display panel includes a display area and a fan-out region, arranged at a side of the display area.

The fan-out region comprises a fan-out wire coupled to a bonding terminal and a bonding terminal arranged in the fan-out region. The display panel comprises a first metallic layer and a second metallic layer. An impedance of the first metallic layer is greater than the impedance of the second metallic layer.

The fan-out wire comprises a first fan-out wire and a second fan-out wire. One or more portions of the first fan-out wire are disposed at the first metallic layer. The second fan-out wire is disposed at the second metallic layer. In a first area that where the first fan-out wire exceeds the second fan-out wire, portions of the first fan-out wire comprise a first portion arranged at the first metallic layer and a second portion disposed at the second metallic layer and coupled to the first portion. A width of one or more of the first fan-out wires arranged at the first area is less than a width of the first fan-out wire arranged at other areas. A distance between the first fan-out wires in the first area is less than the distance between the first fan-out wires in the other areas.

In some embodiments, the first portion comprises one or more first coupling section and second coupling section. A terminal of the first coupling section is coupled to the routing of the display area. A terminal of the second coupling section is coupled to the bonding terminal. One or more of the first coupling section and the second coupling section are coupled to the second portion.

In some embodiments, another terminal of the first coupling section is coupled to a terminal of the second portion; another terminal of the second coupling section is coupled to another terminal of the second portion.

In some embodiments, the first portion further comprises a third coupling section; two terminals of the third coupling section are coupled to the first coupling section and the second coupling section, respectively. The third coupling section and the second portion are arranged in parallel.

In some embodiments, the length of the third coupling section is greater than or equal to the length of the second coupling section.

Advantageous Effect

A display panel and a display device are proposed by the present disclosure. The display panel includes a display area and a fan-out region, arranged at a side of the display area. The fan-out region comprising a fan-out wire coupled to a bonding terminal and a bonding terminal arranged in the fan-out region. The display panel comprises a first metallic layer and a second metallic layer. An impedance of the first metallic layer is greater than the impedance of the second metallic layer. The fan-out wire comprises a first fan-out wire and a second fan-out wire. One or more portions of the first fan-out wire are disposed at the first metallic layer. The second fan-out wire is disposed at the second metallic layer. In a first area that where the first fan-out wire exceeds the second fan-out wire, portions of the first fan-out wire comprise a first portion arranged at the first metallic layer and a second portion disposed at the second metallic layer and coupled to the first portion. A width of one or more of the first fan-out wires arranged at the first area is less than a width of the first fan-out wire arranged at other areas. A distance between the first fan-out wires in the first area is less than the distance between the first fan-out wires in the other areas. In the present disclosure, the first fan-out wire in a first area is designed as a first portion of the first metallic layer and a second portion of a second metallic layer. The first portion of the first metallic layer is coupled to the second portion of the second metallic layer. The width of one or more of the first fan-out wire in the first area is less than the width of the fan-out wires in other areas. And/or the distance between the first fan-out wires in the first area is less than the distance between the first fan-out wires in the other areas. While the impedance of the first fan-out wire is not increased or even reduced, the space occupied by the first fan-out wire is reduced. Therefore, the impedance of the first fan-out wire is decreased to prevent the space occupied by the first fan-out wire from getting enlarged and avoid the bezel of the display panel from getting enlarged.

DETAILED DESCRIPTION OF THE EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
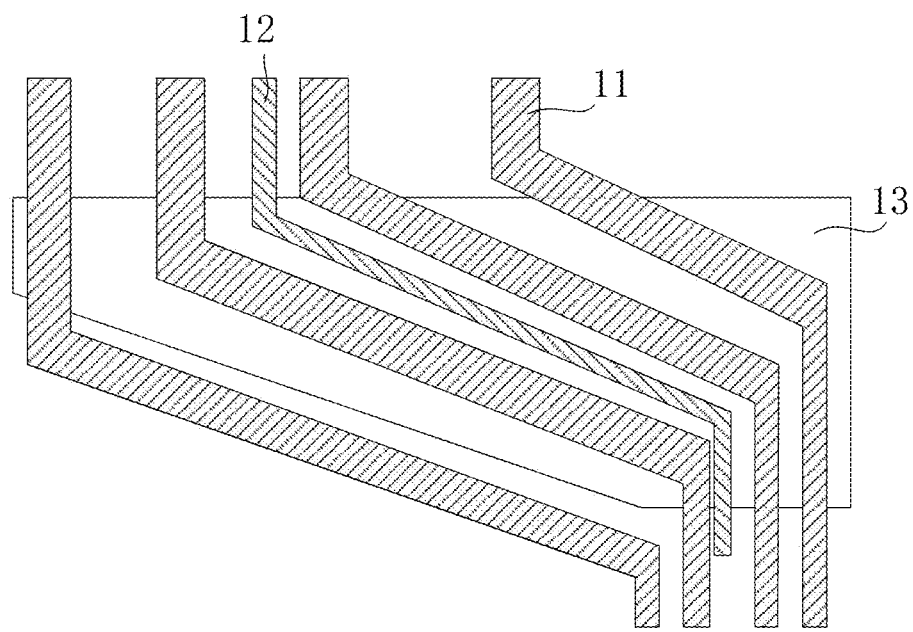
FIG. 1 is a diagram of a conventional display panel.

Please refer to FIG. 1. The width of a first fan-out wire 11 is increased to make the impedances of fan-out wires in different layers the same in a display device of the related art to make the impedances of a first fan-out wire 11 in a first metallic layer and the impedances of a second fan-out wire 12 in a second metallic layer similar or the same. However, the first fan-out wire 11 exceeds an area 13 where the second fan-out wire 12 is arranged, which causes the first fan-out wire 11 to occupy larger space and causes the bezel of the display panel to be wider, as shown in FIG. 1, so the display device of the related art has the technical problem that the first fan-out wire 11 occupies larger space, causing the display panel with a wider bezel.

To present the layout of the first fan-out wire, only one portion of the second fan-out wire 12 is illustrated in FIG. 1. The second fan-out wire 12 is arranged based on practical needs.

The present disclosure proposes a new display panel and a new display device to try to deal with the technical problem as mentioned above.

Figure 2:
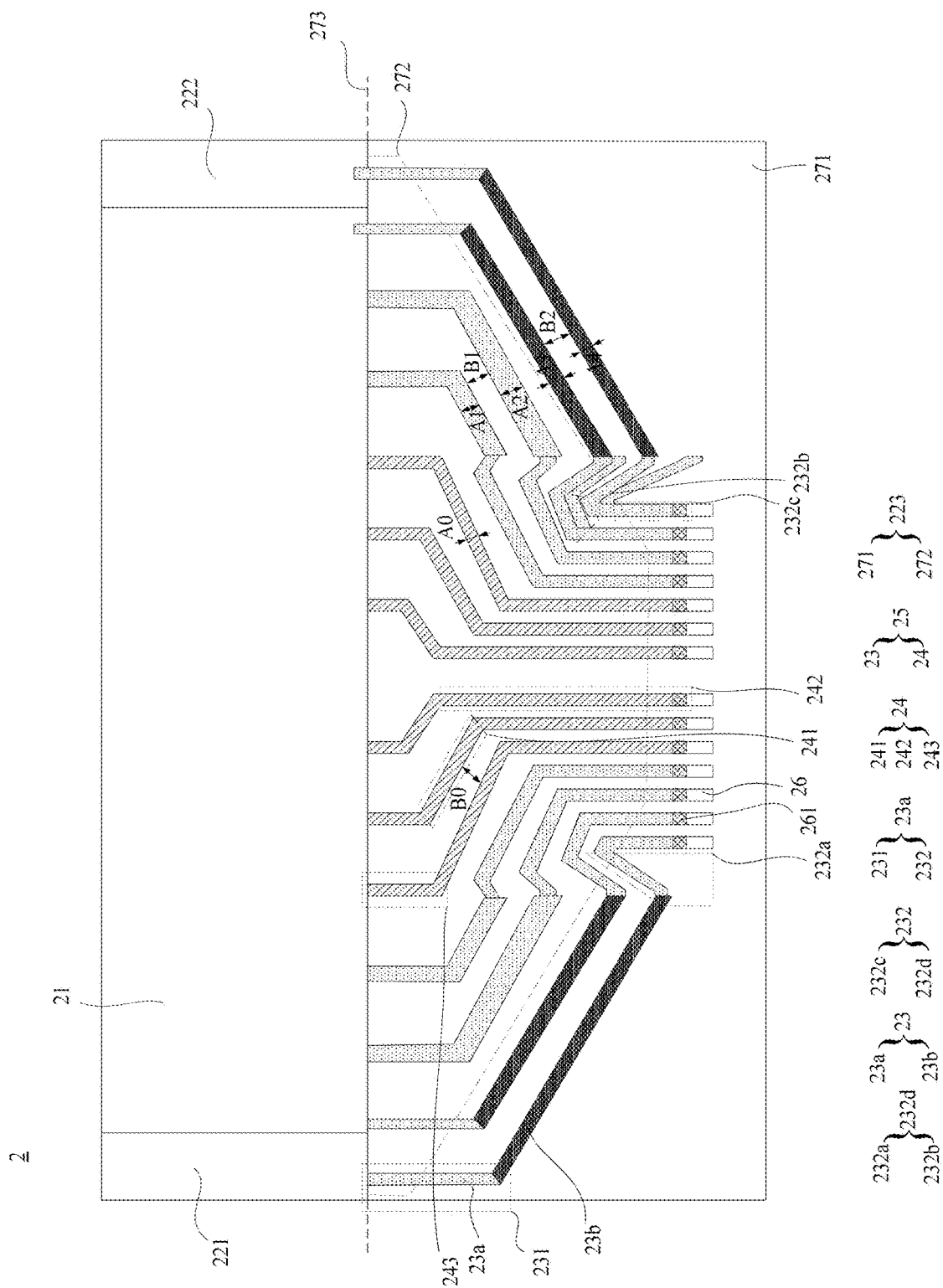
FIG. 2 is a diagram of a display panel according to a first embodiment of the present disclosure.
Figure 3:
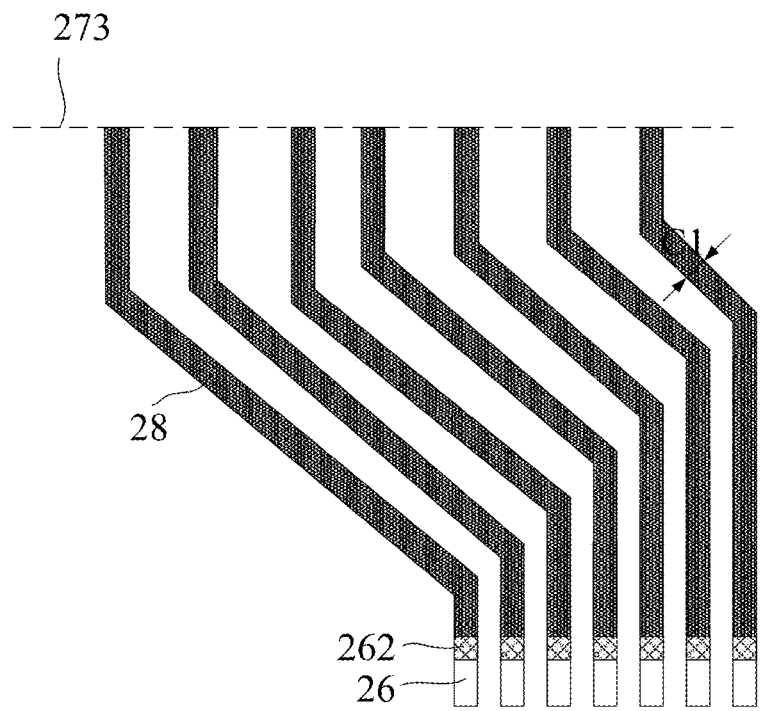
FIG. 3 is a diagram of a display panel according to a second embodiment of the present disclosure.
Figure 4:
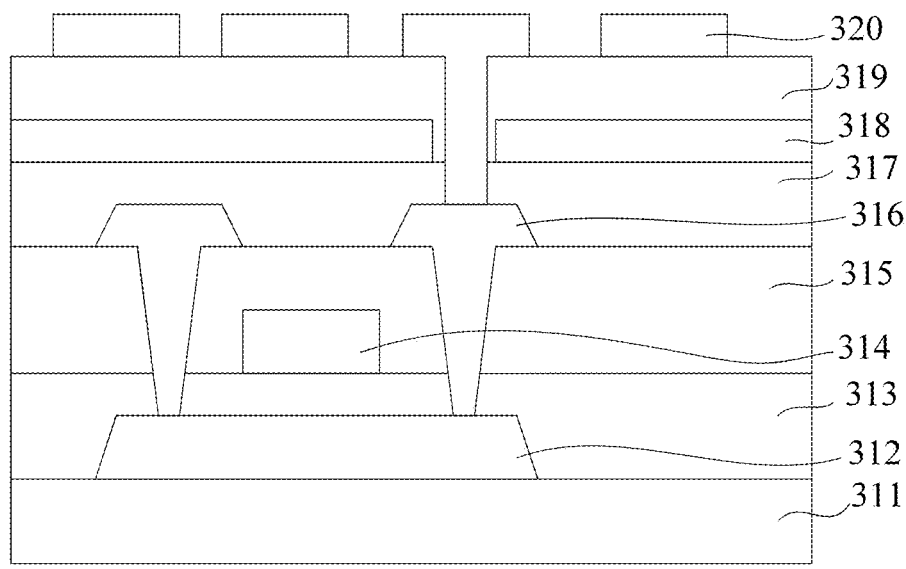
FIG. 4 is a diagram of a display panel according to a third embodiment of the present disclosure.

Please refer to FIG. 2, FIG. 3, and FIG. 4. A display panel 2 proposed by the preferred embodiment of the present disclosure includes a display area 21 and a fan-out region 223. The fan-out region 223 is disposed at one side of the display area 21. The fan-out region 223 includes a fan-out wire and a bonding terminal 26. The fan-out wire is coupling to the bonding terminal 26.

The display panel 2 includes a first metallic layer 314 and a second metallic layer 316. The impedance of the material for the first metallic layer 314 is greater than the impedance of the material for the second metallic layer 316. The fan-out wire includes the first fan-out wire 25 and the second fan-out wire 28. One or more portions of the first fan-out wire 25 are disposed at the first metallic layer 314. The second fan-out wire 28 is disposed at the second metallic layer 316, and the second fan-out wire 28 in the first fan-out wire 25 exceeds the first area 271 of the second fan-out wire 28. One or more portions of the first fan-out wire 25 include a first portion 23a arranged at the first metallic layer 314 and a second portion 23b disposed at the second metallic layer 316.

Besides, the first portion 23a is coupled to the second portion 23b, and the width of one or more of the first fan-out wires 25 arranged at the first area 271 is less than the width of the first fan-out wire 25 arranged at the other areas. (For example, the width A3 of the first fan-out wire 25 in the first area 271 is less than the width A2 of the fan-out wire 25 in the second area 272 in FIG. 1.) And/or the distance between the first fan-out wires 25 in the first area 271 is less than the distance between the first fan-out wires 25 in the other areas. (For example, the distance B2 between the first fan-out wires 25 in the first area 271 is less than the distance B1 between the fan-out wires 25 in the second area 272 in FIG. 1.)

The display device includes a display panel 2 and a driving chip. The first fan-out wire in the first area is set as the first portion in the first metallic layer and as the second portion of the second metallic layer. The first portion is coupled to the second portion. The width of one or more of the first fan-out wires in the first area is less than the width of one or more of the first fan-out wires in the other areas.

In another embodiment, the distance between the first fan-out wires in the first area is less than the distance between the first fan-out wires in the other areas. While the impedance of the first fan-out wire is not increased or even reduced, the space occupied by the first fan-out wire is reduced. Therefore, the impedance of the first fan-out wire is decreased to prevent the space occupied by the first fan-out wire from getting enlarged and avoid the bezel from getting enlarged.

The significance of the width A3 of the first fan-out wire 25 in the first area 271 is less than the width A2 of the fan-out wire 25 in the other areas lies in that the maximum width of the first fan-out wire 25 in the first area 271 is certainly less than the maximum width of the fan-out wire 25 in the other areas when a plurality of the fan-out wires 25 are arranged in the first area 271. In other words, regardless of the width of the fan-out wire 25 in the first area 271 and the width of the fan-out wire 25 in the other areas, the maximum width of the first fan-out wire 25 in the first area 271 is certainly less than the maximum width of the fan-out wire 25 in the other areas so that the space occupied by the first fan-out wire 25 is reduced and the bezel is narrowed.

Specifically, for example, the width of the fan-out wire of the first area increases from approaching the display area 21 to away from the display area 21. The maximum width of the first fan-out wire in the first area is less than the maximum width of the first fan-out wire in the other areas. Moreover, the minimum width of the first fan-out wire of the first area may be less than the maximum width of the first fan-out wire in the other areas. The maximum width of the first fan-out wire of the first area may be less than the minimum width of the first fan-out wire in the other areas. The minimum width of the first fan-out wire of the first area may be less than the minimum width of the first fan-out wire in the other areas. For every two of the first fan-out wires of the first area is arranged gradually, each of the first fan-out wires of the first area is arranged at equal intervals, or other methods of arrangement, the similar designs may be applied. There is no repetition here.

As shown in FIG. 2, the first fan-out wire 25 includes a third sub-routing 24 and a fourth sub-routing 23. That is to say, the fourth sub-routing 23 in the first area 271 includes a first portion 23a and a second portion 23b in FIG. 2. Practically, the first fan-out wire 25 in the first area 271 includes the first portion 23a and the second portion 23b. There is no repetition here.

The display panel 2 includes a display area 21 a non-display area. The non-display area includes a fan-out region 223. Specifically, the non-display area includes a fan-out region 223 and a lower non-display area, a left non-display area 221, a right non-display area 222, and an upper non-display area. Although the left non-display area 221 and the right non-display area 222 are illustrated in FIG. 2, it does not mean that the display panel 2 proposed by the embodiment of the present disclosure is confined to definitely include the left non-display area 221 and the right non-display area 222. The display panel 2 includes the non-display area optionally in the embodiment of the present disclosure based on a practical need. However, the display panel 2 is required to include the display area 21 and the fan-out region 223 in the present disclosure.

The fan-out wire shown in FIG. 2 is the first fan-out wire. Specifically, the first fan-out wire in diverse designs is detailed in the preferred embodiment of the present disclosure.

There is a borderline between different portions of the fan-out wire or different coupling sections of the fan-out wire, but the fan-out wire on the same layer is integrated as one without any practical borderline in the practical arrangement process. Each of the portions of the fan-out wire is clearly defined as shown in figures in the embodiment of the present disclosure, so the detail of the fan-out wire will not be provided.

The fan-out wire is coupled to the bonding terminal 26 so one portion of the fan-out wire covering the bonding terminal 26 is shown. The portion is a second coupling section 232 in FIG. 2, and the cover portion of the second coupling section 232 and the bonding terminal 26 is shown in reference numeral 261 in FIG. 2. The portion is a fan-out wire 28 in FIG. 3, and the cover portion of the second coupling section 232 and the bonding terminal 26 is shown in reference numeral 261 in FIG. 3.

As shown in FIG. 2, the first portion 23a includes one or more first coupling sections 231 and one or more second coupling sections 232. One terminal of the first coupling section 231 is coupled to the routing of the display area 21. One terminal of the second coupling sections 232 is coupled to the bonding terminal 26. One or more of the first coupling section 231 and the second coupling section 232 are coupled to the second section 23b. Owing to the coupling of one or more of the first coupling section 231 and the second coupling section 232 to the second section 23b, the impedance of the first fan-out wire is reduced, thereby shortening the line width of the first fan-out wire and/or decreasing the distance between the first fan-out wires, and further reducing the space occupied by the first fan-out wire and narrowing the bezel of the display panel.

The coupling in the embodiment of the present disclosure referred to coupling of one terminal and coupling of both terminals (i.e., coupling in parallel). The coupling further includes directly overlapping arrangement of some of the areas, the detail of which will not be repeated anymore.

The second coupling section 232 includes a bending section 232d and a straight section 232c. The bending section 232d includes a first bending section 232a and a second bending section 232b. When the width of the second coupling section 232 is reduced, the width of each of the sections of the second coupling section 232 is shortened as well. The detail is skipped here.

As shown in FIG. 2, another terminal of the first coupling section 231 is coupled to one terminal of the second section 23b. Another terminal of the second section 23b is coupled to another terminal of the second coupling section 232. The coupling portion of the first coupling section 231 and the second coupling section 232 is formed by the second metallic layer so that the second portion is coupled to the first coupling section 231 and the second coupling section 232 via a hole, respectively. Therefore, the space occupied by the first fan-out wire is reduced without increasing the impedance of the first fan-out wire (instead, decreasing the impedance of the first fan-out wire, and further the bezel of the display panel 2 is narrowed.

Figure 5:
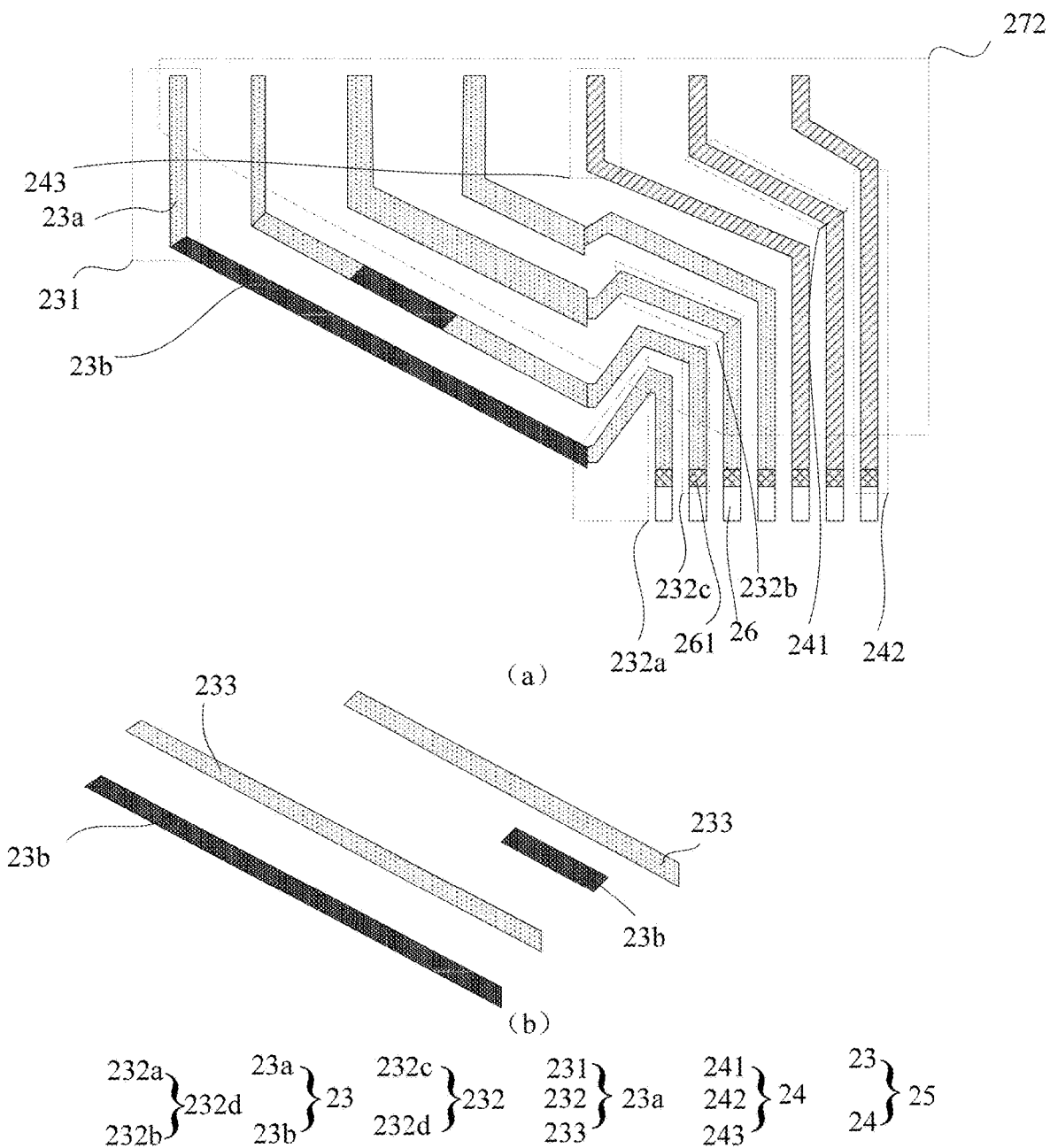
FIG. 5 is a diagram of a display panel according to a fourth embodiment of the present disclosure.

The present disclosure tries to manage a problem that the width of the first fan-out wire may result in an increase in impedance of the first fan-out wire. In a preferred embodiment, as shown in FIG. 5, the first portion 23a further includes a third coupling section 233. Two terminals of the third coupling section 233 are coupled to the first coupling section 231 and the second coupling section 232, respectively, and the third coupling section 233 and the second portion 23b are coupled in parallel. Owing to the coupling of the third coupling section 233 and the second portion 23b in parallel, the line width of the first fan-out wire is reduced, the impedance of the first fan-out wire is decreased, and the bezel of the display panel 2 is narrowed.

As FIG. 5 shows, the length of the third coupling section 233 is greater than or equal to the length of the second portion 23b. Owing to the equality of the length of the third coupling section 233 and the length of the second portion 23b, the impedance of the first fan-out wire is reduced to the greatest extent, thereby reducing the space occupied by the first fan-out wire and narrowing the bezel of the display panel 2 correspondingly.

As illustrated in FIG. 5(a), the third coupling section 233 and the second portion 23b are coupled in parallel in the first fan-out wire outside the second area 272. As illustrated in FIG. 5(b), the third coupling section 233 in the first fan-out wire 25 which is arranged outermost in FIG. 5(a) and the second portion 23b are coupled in parallel so the second portion 23b covers and the third coupling section 233 is not shown in FIG. 5(a). The third coupling section 233 of the first fan-out wire 25 ranked second from the last is coupling in parallel with the second portion 23b in FIG. 5(a) so the third coupling section 233 covers the second portion 23b of FIG. 5(a) partially. Owing to the coupling of the third coupling section 233 and the second portion 23b, the impedance of the first fan-out wire is reduced, thereby reducing the space occupied by the first fan-out wire and narrowing the bezel of the display panel 2 correspondingly, thereby shortening the line width of the first fan-out wire and/or decreasing the distance between the first fan-out wires, and further reducing the space occupied by the first fan-out wire and narrowing the bezel of the display panel.

Please refer to FIG. 5. The length of the third coupling section of the different first fan-out wires 25 may be different from the length of the coupling portion of the second portion. In other words, the length of the third coupling section of the different first fan-out wires 25 may be different from the length of the coupling portion of the second portion when the third coupling section is arranged, and further the range of the impedance of the first fan-out wires 25 is different. Owing to the difference in the length of the different first fan-out wires 25, the impedance of each of the first fan-out wires 25 may be proximally equal, and further the display unity of display panel 2 is improved.

The length of the coupling section and the second portion in parallel arrangement gradually increases in the direction from the second area to the first area in the first fan-out wire in the first area.

A preferred embodiment of the present disclosure tries to deal with the problem that the fan-out wire occupies greater space when the first portion and the second portion are coupled.

Figure 6:
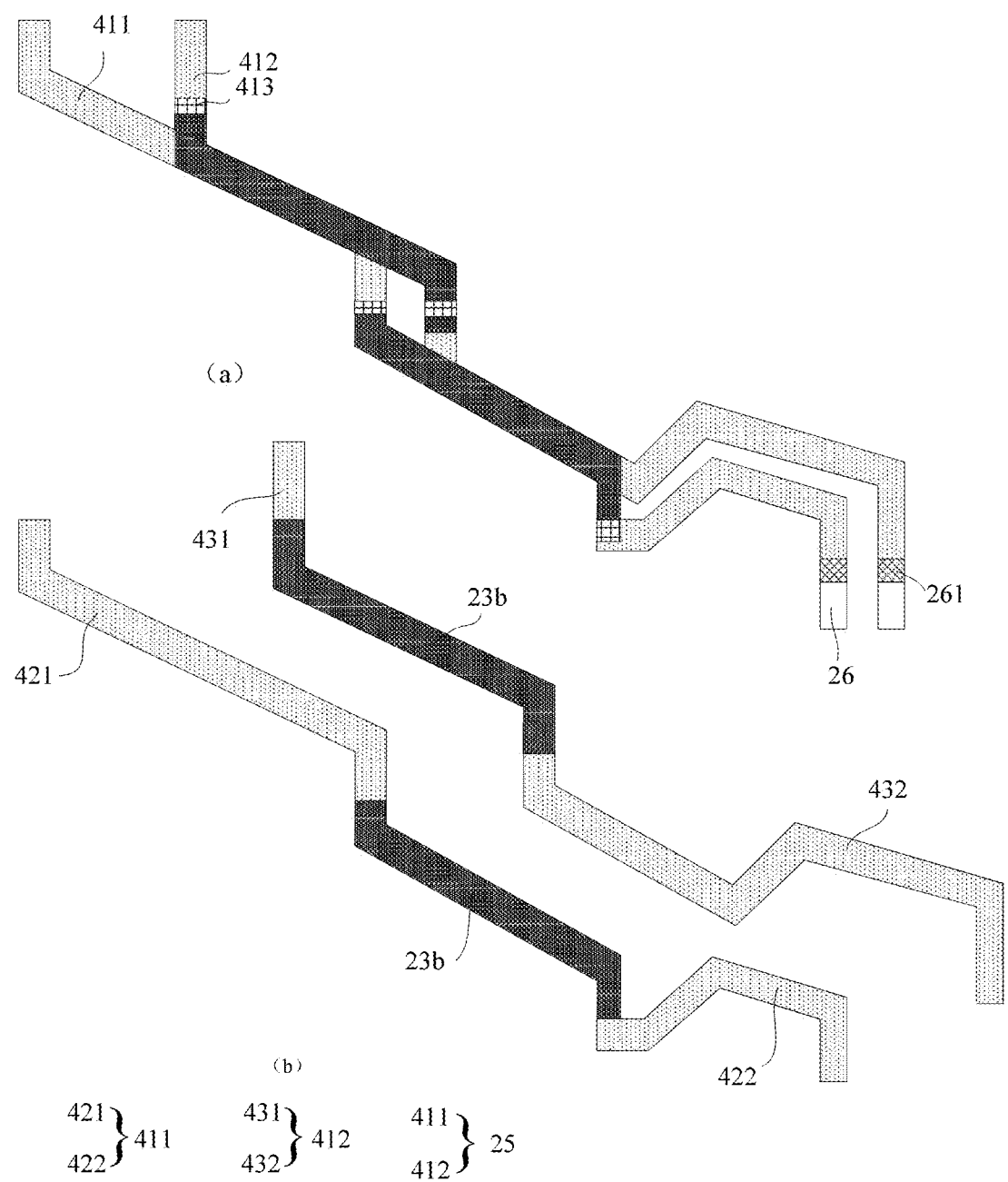
FIG. 6 is a diagram of a display panel according to a fifth embodiment of the present disclosure.

Please refer to FIG. 6. The first fan-out wire 25 includes a first sub-routing 411 and a second sub-routing 412. The first sub-routing 411 is disposed adjacent to the second sub-routing 412. The first sub-routing 411 includes a first portion and a second portion 23b. The second sub-routing 412 includes a first portion and a second portion 23b. Besides, the projection of one or more of the first portions of the first sub-routing 411 overlaps the projection of one or more of the second portion 23b in the second sub-routing 412. And/or the projection of one or more of the second portions 23b of the first sub-routing 411 overlaps the projection of one or more of the first portions of the second portion 23b in the second sub-routing 412. By overlapping and interweaving one or more of the first portions and one or more of the second portions 23b in the first sub-routing and the second sub-routing cross overlapped, the space occupied by the first sub-routing and the space occupied by the second sub-routing are reduced. Compared with the decrease in the line width and the distance, there is no distance between the routings or there is no distance at the thread owing to some of the routings overlap. Compared with the decrease in the line width and the distance, the space occupied by the first sub-routing is reduced, and further the bezel of the display panel 2 is narrowed.

To better present the layout of each of the portions and the coupling of each of the portions, the coupling between the first portion and the second portion is not shown in some of the figures. Practically, the routing in the first portion crosses and is coupled to the routing in the second portion through a hole. The full details are skipped here.

Please refer to FIG. 6. The first portion of the first sub-routing 411 includes a fourth coupling section 421 and a fifth coupling section 422. One terminal of the second portion 23b of the first sub-routing 411 is coupled to the fourth coupling section 421. Another terminal of the second portion 23b of the first sub-routing 411 is coupled to the fifth coupling section 422.

The first portion of the second sub-routing 412 includes a sixth coupling section 431 and a seventh coupling section 432. One terminal of the second portion 23b of the second sub-routing 412 is coupled to the sixth coupling section 431. Another terminal of the second portion 23b of the second sub-routing 412 is coupled to the seventh coupling section 432.

The fourth coupling section 421 overlaps the second portion 23b of the second sub-routing 412 partially. The seventh coupling section 432 overlaps the second portion 23b of the first sub-routing 411 partially. The first portion of the first sub-routing overlaps the second portion of the second sub-routing partially. The second portion of the first sub-routing overlaps the first portion of the second sub-routing partially. Thus, the first sub-routing 411 and the second sub-routing 412 shares the same routing, one or more of the distance between the two routings and the space occupied by the routing are reduced, and the space of the coupling hole and coupling section that needs to be transferred is increased. Compared with the design of a single routing, the footprint of the first fan-out wire is reduced, and further the bezel of the display panel 2 is narrowed.

FIG. 6(a) shows the coupling of the first fan-out wire of the first area. FIG. 6(b) shows the exploded view of two of the first fan-out wires. As seen in FIG. 6, it is only necessary to increase some space for the coupling 413 of the first portion and the second portion 23b when the two first fan-out wires are arranged in the same routing space. Compared with each of the first fan-out wires which are arranged alone, the bezel of the display panel 2 is narrowed.

The full details of the third coupling section parallel to the second section in arrangement or the second section directly coupled to the first coupling section and the second coupling section are provided in the embodiment of the present disclosure. Because the length of the third coupling section accounts for a greater length of the first fan-out wire, the width of the third coupling section is increased to reduce the impedance of the first fan-out wire, and the third coupling section is located outside the second fan-out wire. However, when the first coupling section and the second coupling section are also disposed outside the second fan-out wire, the first coupling section and the second coupling section can be designed in the same way to reduce the impedance of the first fan-out wire and the space occupied by the first fan-out wire. The full details are skipped here.

Figure 7:
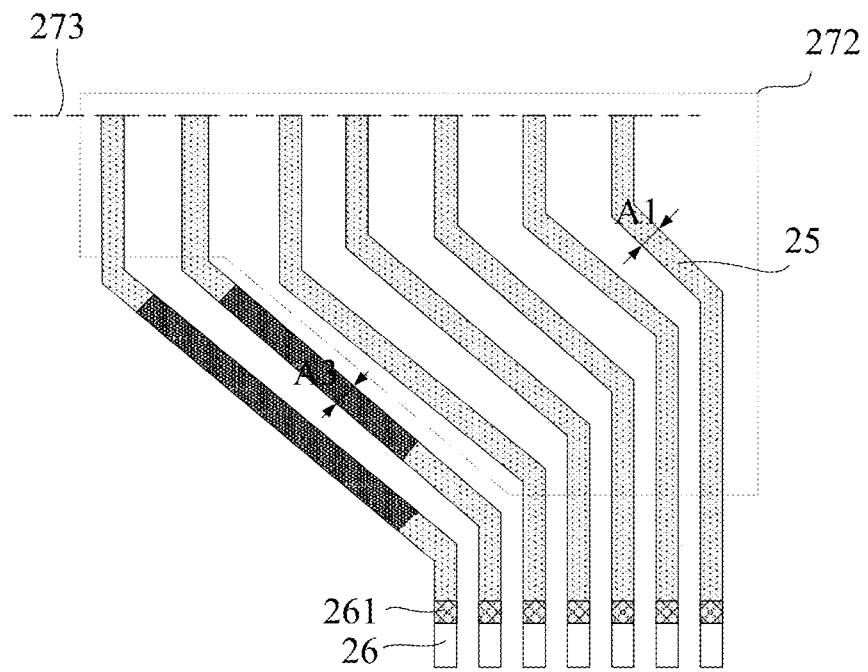
FIG. 7 is a diagram of a display panel according to a sixth embodiment of the present disclosure.

Please refer to FIG. 3 and FIG. 7. A second area 272 is an area where the first fan-out wire 25 and the second fan-out wire 28 overlap. The width A1 of each of the first fan-out wires 25 is equal and the width C1 of the second fan-out wires 28 is equal. Besides, the width A1 of the first fan-out wire 25 is greater than the width C1 of the second fan-out wire 28; that is, A1 is greater than C1. To make the width of the respective routings of the first fan-out wire equal, the width of the first fan-out wire may be reduced. In addition, the first fan-out wire is made from the first metallic layer and second metallic layer to reduce the space occupied by the first fan-out wire. Therefore, the impedance of the first fan-out wire is decreased and the space occupied by the first fan-out wire is reduced as well.

The present disclosure tries to manage the problem that the width of the first fan-out wire may result in an increase in the width of the first fan-out wire. In a preferred embodiment, the width A3 of the first fan-out wire 25 in the first area 271 is less than the width A1 of the first fan-out wire 25 in the second area 272; that is, A3 is less than A1, as shown in FIG. 7. Owing to the decrease in the line width of the first fan-out wire 25 which exceeds the area where the second fan-out wire is arranged, the space occupied by the first fan-out wire is reduced and the bezel of the display panel 2 is narrowed.

When the width of the first fan-out wire in the first area is less than the width of the fan-out wire in the second area, the width of the first fan-out wire in the first area is the same or the width of the first fan-out wire in the first area is gradually increased. For example, the width of the first fan-out wire in the first area may be A3 or A4 in FIG. 2. A3 may be equal to A4, or A3 may be less than A4.

Because the width of the first fan-out wire is gradually increased to reduce the impedance of the first fan-out wire and the uniformity of the display panel, the problem is that the width of the first fan-out wire causes the first fan-out wire to occupy the large space. In a preferred embodiment of the present disclosure, as shown in FIG. 2, a second area 272 is an area where the first fan-out wire 25 and the second fan-out wire 28 overlap. The width of one or more of the first fan-out wires 25 gradually increases in the direction from the middle area toward two sides of the fan-out region 223. (For example, A2 is greater than A1.) Owing to the gradual increase in the width of the first sub-routing 25, the impedance of the first fan-out wire is decreased. Because the first fan-out wire is made from the first metallic layer and the second metallic layer, the impedance of the display panel 2 is reduced, the uniformity of the display panel 2 is better, and the bezel of the display panel 2 is narrowed.

Please refer to FIG. 2. The first fan-out wire 25 includes a third sub-routing 24 and a fourth sub-routing 23. The fourth sub-routing 23 is disposed at both sides of the third sub-routing 24. The fourth sub-routing 23 includes a third portion, a fourth portion, and a fifth portion. Both terminals of the fourth portion are coupled to the third portion and the fifth portion, respectively. The fifth portion is coupled to the bonding terminal 26. One portion or more of the fourth portion of the fourth sub-routing 23 is bent in a direction away from the display area 21. The width of one or more of the third portion, the fourth portion, and the fifth portion is greater than the width of the third sub-routing 24. (For example, the width A1 of the fourth sub-routing is greater than the width A0 of the fourth sub-routing.) By bending the first fan-out wire in the direction away from the display area 21, the first fan-out wire occupies the left and right hollow space. Further, by reducing the space of the lower bezel that the first fan-out wire occupies and by forming the first fan-out wire with the first metallic layer and the second metallic layer, which are disposed on the first area, the first fan-out wire occupies less space.

As shown in FIG. 2, the third sub-routing 24 includes a sixth portion 241, a seventh portion 242, and an eighth portion 243. Two terminals of the sixth portion 241 are coupled to the seventh portion 242 and the eighth portion 243. Another terminal of seventh portion 242, and an eighth portion 243 is coupled to the bonding terminal 26. The width of the sixth portion 241, the width of the seventh portion 242, and the width of the eighth portion 243 are all equal. Owing to the indifference in the width of each of the portions of the third sub-routing, the width of the fourth sub-routing is greater than the width of the third sub-routing so that the space occupied by the third sub-routing is less while the impedance of the fourth sub-routing is close to or even equal to the impedance of the third sub-routing. In addition, the width of the first fan-out wire outside the second fan-out wire so that the space occupied by the first fan-out wire is reduced.

The division of the fourth portion, the fifth portion, and the sixth portion may be the same as the division of the sixth portion, the seventh portion, and the eighth portion.

As shown in FIG. 2, the width of the fourth sub-routing 23 gradually increases at the junction of the third sub-routing 24 and the fourth sub-routing 23 in the direction away from the third sub-routing 24. (For example, A2 is greater than A1.)

Specifically, the width of each of the areas of the third sub-routing is the same. The width of the third portion of the fourth sub-routing is greater than the width of the third sub-routing. The width of the fifth portion of the fourth sub-routing is equal to the width of the third sub-routing. Besides, the width of the first portion of the second fan-out wire gradually increases at the junction of the third sub-routing 24 and the fourth sub-routing 23 in the direction away from the third sub-routing 24.

As shown in FIG. 2, the width A3 of the first fan-out wire 25 in the first area 271 is less than the width A3 of the first fan-out wire 25 in the second area 272 and is closest to the width A2 of the first fan-out wire 25 of the first area 271. Because the width A3 of the first fan-out wire 25 is less than the width A3 of the first fan-out wire 25 in the second area 272, the line width of the first fan-out wire 25 is lessened, the space occupied by the first fan-out wire 25 is reduced, the bezel of the display panel 2 is narrowed.

The width A3 of the first fan-out wire 25 in the first area 271 is greater than or equal to the width A3 of the first fan-out wire 25 in the second area 272 and is closest to the width A2 of the first fan-out wire 25 of the first area 271, and the distance between the first fan-out wires of the first area 271 is less than the distance between the first fan-out wires in the other areas. Because the width A3 of the first fan-out wire 25 is greater than or equal to the width A3 of the first fan-out wire 25 in the second area 272 and is closest to the width A2 of the first fan-out wire 25 of the first area 271, the impedance of the first fan-out wire is further decreased. The bezel of the display panel 2 is narrowed. Besides, the distance between the first fan-out wires of the first area is less than the distance between the first fan-out wires in the other areas so that the bezel can be narrowed.

To increase the line width of the first fan-out wire 25, the distance between the first fan-out wires 25 needs to be widened, causing the space occupied by the first fan-out wire 25 to increase. In a preferred embodiment of the present disclosure, the distance between one or more first sub-routings 411 gradually increases in the direction of the middle area of the first sub-routing 411 toward two sides of the fan-out region 223. (For example, B2 is greater than B1.) Owing to a gradual increase in the distance between the first sub-routings 411, the impedance of the first sub-routing 411 is reduced and the display uniformity of the display panel 2 is better. Because the first sub-routing 411 in the first area is formed by the first metallic layer and the second layer, the space occupied by the first fan-out wire 25 is reduced and the bezel of the display panel 2 is narrowed.

As shown in FIG. 2, the distance between the first fan-out wires 25 in the first area 271 is less than the minimum distance between the first fan-out wires 25 in the second area. (For example, B2 is less than B0.) Owing to the decrease in the space of the first fan-out wire in the first area, the space occupied by the first fan-out wire is reduced and further the bezel of the display panel 2 is narrowed.

The distance between the first fan-out wires 25 in the first area 271 is greater than or equal to the distance between the first fan-out wires in the other areas. Because the distance between the first fan-out wires 25 in the first area 271 is greater than or equal to the distance between the first fan-out wires in the other areas and the distance between the first fan-out wires 25 in the first area 271 is less than the distance between the first fan-out wires in the other areas, the bezel is narrowed.

The first fan-out wire in different designs is detailed in the embodiment of the present disclosure, but the first fan-out wire is not confined by the embodiment of the present disclosure. The display panel 2 where the first fan-out wire exceeds the second fan-out wire in arrangement may adopt the design proposed by the embodiment of the present disclosure, and the details of the design is skipped here.

The different fan-out wires and the different portions of each of the fan-out wires or the association of each of the fan-out wires are respectively described in the embodiment of the present disclosure. However, the features of a particular feature or a figure is not confined by the present embodiment of the present disclosure. When the technical content is not conflict, the characteristic of a preferred embodiment can be applied to another preferred embodiment. For example, the definition of the line width of the first fan-out wire and the distance between the first fan-out wires may be applied in the same preferred embodiment of the present disclosure. In other words, the embodiment of the present disclosure does not confine that the line width of the first fan-out wire is separated from the distance between the first fan-out wires. The width of the first fan-out wire in the first area is less than the width of the first fan-out wire in the other area in the embodiment of the present disclosure. And/or the distance between the first fan-out wires in the first area is less than the distance between the first fan-out wires in the other areas so that the bezel of the display panel 2 is narrowed. The plan is that one or more of the width of first fan-out wire in the first area and the distance between the first fan-out wire in the first areas are less than their corresponding width of first fan-out wire and corresponding distance between the first fan-out wires.

When the width of one or more first fan-out wires located in the first area is less than the width of the first fan-out wire in the other areas, the distance between the first fan-out wires of the first area may be less than the distance between the fan-out wires in the other areas or the distance between the first fan-out wires in the first area may be greater than or equal to the distance between the fan-out wires in the other areas.

When the width of one or more of the first fan-out wires in the first area is equal to the width of the fan-out wires in other areas and the width of the first fan-out wires in each of the other areas is gradually changed and increased, the distance between the first fan-out wires in the first area may be less than the distance between the fan-out wires in the other areas or the distance between the first fan-out wires in the first area may be greater than or equal to the distance between the fan-out wires in the other areas. When the width of the fan-out wires in other areas does not change or decreases, the distance between the first fan-out wires in the first area may be less than the distance between the fan-out wires in the other areas.

When the width of one or more of the first fan-out wires in the first area is equal to the maximum width of the first fan-out wire in the other areas and the distance between the first fan-out wires in the first area is greater than the distance between the first fan-out wires in the other areas, the distance between the first fan-out wires in the first area may be greater than the minimum distance between the first fan-out wires in the other areas and the distance between the first fan-out wires in the first area may be less than the maximum distance between the first fan-out wires in the other areas. Overall, the bezel of the display panel 2 is reduced.

Further, when the width of one or more of the first fan-out wires in the first area is equal to the maximum width of the first fan-out wire in the other areas and the distance between the first fan-out wires in the first area is greater than the distance between the first fan-out wires in the other areas, the distance between the first fan-out wires in the first area may be greater than the maximum distance between the first fan-out wires in the other areas. However, the bezel of the display panel 2 may still be narrowed because the distance between the first fan-out wires in the first area of the related art may be greater than the maximum distance between the first fan-out wires in the other areas. Similarly, other arrangements may adopt the similar methods to reduce the bezel.

When the width of one or more of the first fan-out wires in the first area is greater than the width of the first fan-out wires in the other areas, the width of the first fan-out wire of each of the areas changes and increases and the distance between the first fan-out wires of each of the areas changes and increases. The distance between the first fan-out wires in the first area may be less than the distance between the first fan-out wires in the other areas. The distance between the first fan-out wires in the first area may be equal to or greater than the distance between the first fan-out wires in the other areas. When the width of the first fan-out wire in each of the areas is equal, the distance between the first fan-out wires in the first area is less than the distance between the first fan-out wires in the other areas.

According to the introduction above, the width of the first fan-out wire and the distance between the first fan-out wires may be confined according to the practical requirements when the bezel of the display panel 2 is narrowed.

The distance between a first fan-out wires is equal in a second area in a preferred embodiment. The distance between the second fan-out wires is equal, and the distance between the first fan-out wires is greater than or equal to the distance between the second fan-out wires. Owing to the equality of the distance between the first fan-out wires and the distance between the second fan-out wires, the projection of the first sub-routing interweaves or overlaps the projection of the second portion in the second sub-routing, and further the space is saved. In addition, the distance between the first fan-out wires is greater than the distance between the second fan-out wires to increase the line width of the first fan-out wire, to decrease the impedance of the first fan-out wire, and to improve the uniformity of the display panel 2.

The relative positions of the first fan-out wire and the second fan-out wire are not limited in the embodiment of the present disclosure. For example, to avoid the parasitic capacitance from getting too large, the projection of the first fan-out wire and the projection of the second fan-out wire are arranged and interwoven. For example, to avoid the area where the fan-out wire is arranged from getting too large, the projection of the first fan-out wire overlaps the projection of the second fan-out wire. However, it is notified that the coupling of the first fan-out wire and the second fan-out wire and the bonding terminal need to be separated to avoid signal crosstalk.

To better present the layout of each of the fan-out wires, some of the fan-out wires are only shown in the figures in the preferred embodiment of the present disclosure. A junction 273 is formed by a fan-out region and a display area 21. Some of the fan-out regions are shown in FIG. 3. However, the layout of the fan-out regions is designed according practical needs. Two of the fan-out regions are arranged symmetrically, and the fan-out regions at another side may be arranged in the same way. The full details are skipped here.

Please refer to FIG. 4. The display panel 2 includes a substrate 311, an active layer 312, a gate insulating layer 313, a first metallic layer 314, an interlayer insulating layer 315, a planarization layer 317, a first electrode layer 318, a passivation layer 319, and a second electrode layer 320.

The fan-out wire is detailed in the embodiment but the specific type of the fan-out wire is not confined by the embodiment. For example, the first fan-out wire is portion of the scanning line, and the second fan-out wire is portion of the data line. The details of the design are skipped here. All signal lines may be designed with the fan-out wires as introduced by the present application.

Figure 8:
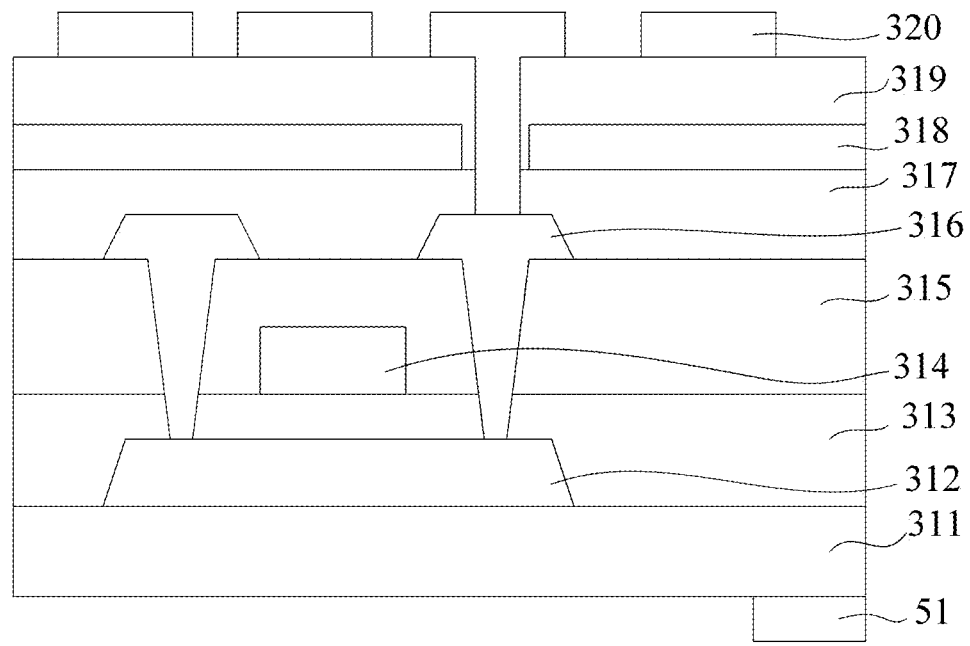
FIG. 8 is a diagram of a display device according to an embodiment of the present disclosure.

As shown in FIG. 2, FIG. 3 and FIG. 8, a display device includes a display panel and a driving chip 51. The display device is as illustrated in FIG. 2.

The display panel 2 includes a display area 21 and a fan-out region 223. The fan-out region 223 is disposed at one side of the display area 21. The fan-out region 223 includes a fan-out wire and a bonding terminal 26. The fan-out wire is coupling to the bonding terminal 26.

The display panel 2 includes a first metallic layer 314 and a second metallic layer 316. The impedance of the material for the first metallic layer 314 is greater than the impedance of the material for the second metallic layer 316. The fan-out wire includes the first fan-out wire 25 and the second fan-out wire 28. One or more portions of the first fan-out wire 25 are disposed at the first metallic layer 314. The second fan-out wire 28 is disposed at the second metallic layer 316, and the second fan-out wire 28 in the first fan-out wire 25 exceeds the first area 271 of the second fan-out wire 28. One or more portions of the first fan-out wire 25 include a first portion 23*a* arranged at the first metallic layer 314 and a second portion 23*b* disposed at the second metallic layer 316. Besides, the first portion 23*a* is coupled to the second portion 23*b*, and the width of one or more of the first fan-out wires 25 arranged at the first area 271 is less than the width of the first fan-out wire 25 arranged at the other areas. (For example, the width A3 of the first fan-out wire 25 in the first area 271 is less than the width A2 of the fan-out wire 25 in the second area 272 in FIG. 1.) And/or the distance between the first fan-out wires 25 in the first area 271 is less than the distance between the first fan-out wires 25 in the other areas. (For example, the distance B2 between the first fan-out wires 25 in the first area 271 is less than the distance B1 between the fan-out wires 25 in the second area 272 in FIG. 1.)

The present embodiment proposes a display device. The display device includes a display panel 2 and a driving chip. The first fan-out wire in the first area is set as the first portion in the first metallic layer and as the second portion of the second metallic layer. The first portion is coupled to the second portion. The width of one or more of the first fan-out wires in the first area is less than the width of one or more of the first fan-out wires in the other areas. And/or the distance between the first fan-out wires in the first area is less than the distance between the first fan-out wires in the other areas. While the impedance of the first fan-out wire is not increased or even reduced, the space occupied by the first fan-out wire is reduced. Therefore, the impedance of the first fan-out wire is decreased to prevent the space occupied by the first fan-out wire from getting enlarged and avoid the bezel from getting enlarged.

In some embodiments, the first portion comprises one or more first coupling section and second coupling section. A terminal of the first coupling section is coupled to the routing of the display area. A terminal of the second coupling section is coupled to the bonding terminal. One or more of the first coupling section and the second coupling section are coupled to the second portion.

In some embodiments, another terminal of the first coupling section is coupled to a terminal of the second portion; another terminal of the second coupling section is coupled to another terminal of the second portion.

In some embodiments, the first portion further comprises a third coupling section; two terminals of the third coupling section are coupled to the first coupling section and the second coupling section, respectively. The third coupling section and the second portion are arranged in parallel.

In some embodiments, the length of the third coupling section is greater than or equal to the length of the second coupling section.

In some embodiments, the first fan-out wire comprises a first fan-out wire and a second fan-out wire. The first sub-routing is disposed adjacent to the second sub-routing; the first sub-routing comprises a first portion and a second portion. The second sub-routing comprises a first portion and a second portion. A projection of one or more of the first portions of the first sub-routing overlaps a projection of one or more of the second portion in the second sub-routing. The projection of one or more of the second portions of the first sub-routing overlaps the projection of one or more of the first portions of the second portion in the second sub-routing.

In some embodiments, the first portion of the first sub-routing comprises a fourth coupling section and a fifth coupling section. One terminal of the second portion of the first sub-routing is coupled to the fourth coupling section. Another terminal of the second portion of the first sub-routing is coupled to the fifth coupling section.

The first portion of the second sub-routing comprises a sixth coupling section and a seventh coupling section. One terminal of the second portion of the second sub-routing is coupled to the sixth coupling section. Another terminal of the second portion of the second sub-routing is coupled to the seventh coupling section.

The fourth coupling section overlaps the second portion of the second sub-routing partially, the seventh coupling section overlaps the second portion of the first sub-routing partially.

A display panel and a display device are proposed by the present disclosure. The display panel includes a display area and a fan-out region, arranged at a side of the display area. The fan-out region comprising a fan-out wire coupled to a bonding terminal and a bonding terminal arranged in the fan-out region. The display panel comprises a first metallic layer and a second metallic layer. An impedance of the first metallic layer is greater than the impedance of the second metallic layer. The fan-out wire comprises a first fan-out wire and a second fan-out wire. One or more portions of the first fan-out wire are disposed at the first metallic layer. The second fan-out wire is disposed at the second metallic layer. In a first area that where the first fan-out wire exceeds the second fan-out wire, portions of the first fan-out wire comprise a first portion arranged at the first metallic layer and a second portion disposed at the second metallic layer and coupled to the first portion. A width of one or more of the first fan-out wires arranged at the first area is less than a width of the first fan-out wire arranged at other areas. A distance between the first fan-out wires in the first area is less than the distance between the first fan-out wires in the other areas. In the present disclosure, the first fan-out wire in a first area is designed as a first portion of the first metallic layer and a second portion of a second metallic layer. The first portion of the first metallic layer is coupled to the second portion of the second metallic layer. The width of one or more of the first fan-out wire in the first area is less than the width of the fan-out wires in other areas. And/or the distance between the first fan-out wires in the first area is less than the distance between the first fan-out wires in the other areas. While the impedance of the first fan-out wire is not increased or even reduced, the space occupied by the first fan-out wire is reduced. Therefore, the impedance of the first fan-out wire is decreased to prevent the space occupied by the first fan-out wire from getting enlarged and avoid the bezel of the display panel from getting enlarged.

Above are embodiments of the present disclosure, which does not limit the scope of the present disclosure. Any modifications, equivalent replacements or improvements within the spirit and principles of the embodiment described above should be covered by the protected scope of the disclosure.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:
1. A display panel, comprising:
a display area; and
a fan-out region, arranged at a side of the display area, the fan-out region comprising a fan-out wire coupled to a bonding terminal and the bonding terminal arranged in the fan-out region;
wherein the display panel comprises a first metallic layer and a second metallic layer, the fan-out wire comprises a first fan-out wire and a second fan-out wire, in a first area, portions of the first fan-out wire comprise a first portion and a second portion;

wherein the first portion comprises one or more of a first coupling section and a second coupling section, a terminal of the first coupling section is coupled to a routing of the display area; a terminal of the second coupling section is coupled to the bonding terminal, and one or more of the first coupling section and the second coupling section are coupled to the second portion; and wherein a coupling of the first fan-out wire and the second fan-out wire and the bonding terminal are separated.

2. The display panel according to claim 1, wherein a coupling portion of the first coupling section and the second coupling section is formed by the second metallic layer so that the second portion is coupled to the first coupling section and the second coupling section via a hole, respectively.

3. The display panel according to claim 1, wherein an impedance of the first metallic layer is greater than the impedance of the second metallic layer, a width of one or more of the first fan-out wires arranged at the first area is less than a width of the first fan-out wire arranged at other areas, and a distance between the first fan-out wires in the first area is less than the distance between the first fan-out wires in the other areas.

4. The display panel according to claim 1, wherein another terminal of the first coupling section is coupled to a terminal of the second portion, and another terminal of the second coupling section is coupled to another terminal of the second portion.

5. The display panel according to claim 1, wherein the first portion further comprises a third coupling section, two terminals of the third coupling section are coupled to the first coupling section and the second coupling section, respectively, and the third coupling section and the second portion are arranged in parallel.

6. The display panel according to claim 4, wherein a length of the third coupling section of the first fan-out wire is different from a length of a coupling portion of the second portion.

7. The display panel according to claim 4, wherein a length of the third coupling section and the second portion in parallel arrangement gradually increases in a direction from a second area to the first area in the first fan-out wire in the first area.

8. The display panel according to claim 4, wherein the length of the third coupling section is greater than or equal to the length of the second coupling section.

9. The display panel according to claim 1, wherein the first fan-out wire is made from the first metallic layer and second metallic layer.

10. The display panel according to claim 1, wherein the first fan-out wire comprises a first sub-routing and a second sub-routing, the first sub-routing is disposed adjacent to the second sub-routing; the first sub-routing comprises a first portion and a second portion, the second sub-routing comprises a first portion and a second portion, a projection of one or more of the first portions of the first sub-routing overlaps a projection of one or more of the second portion in the second sub-routing, and/or the projection of one or more of the second portions of the first sub-routing overlaps the projection of one or more of the first portions of the second portion in the second sub-routing.

11. The display panel according to claim 10, wherein the first portion of the first sub-routing comprises a fourth coupling section and a fifth coupling section; one terminal of the second portion of the first sub-routing is coupled to the fourth coupling section; another terminal of the second portion of the first sub-routing is coupled to the fifth coupling section;

wherein the first portion of the second sub-routing comprises a sixth coupling section and a seventh coupling section; one terminal of the second portion of the second sub-routing is coupled to the sixth coupling section; another terminal of the second portion of the second sub-routing is coupled to the seventh coupling section; and wherein the fourth coupling section overlaps the second portion of the second sub-routing partially; the seventh coupling section overlaps the second portion of the first sub-routing partially.

12. The display panel according to claim 1, wherein a second area where the first fan-out wire and the second fan-out wire overlap, the width of each of the first fan-out wires is equal and the width of the second fan-out wires is equal, the width of the first fan-out wire is greater than the width of the second fan-out wire, and the width of the first fan-out wire in the first area is less than the width of the first fan-out wire in the second area.

13. The display panel according to claim 1, wherein the second area is an area where the first fan-out wire and the second fan-out wire overlap, the width of one or more of the first fan-out wires gradually increases in a direction from a middle area toward two sides of the fan-out region.

14. The display panel according to claim 13, wherein the width of the first fan-out wire in the first area is less than the width of the first fan-out wire in the second area and is closest to the width of the first fan-out wire of the first area.

15. The display panel according to claim 13, wherein the width of the first fan-out wire in the first area is greater than or equal to the width of the first fan-out wire in the second area and is closest to the width of the first fan-out wire of the first area; the distance between the first fan-out wires of the first area is less than the distance between the first fan-out wires in the other areas.

16. The display panel according to claim 13, wherein the distance between one or more of the first sub-routings gradually increases in the direction of the middle area of the first sub-routing toward two sides of the fan-out region, and the distance between the first fan-out wires in the first area is less than the minimum distance between the first fan-out wires in the second area.

17. The display panel according to claim 13, wherein the distance between the first fan-out wires in the first area is greater than or equal to the distance between the first fan-out wires in the other areas.

18. A display device comprising:
a driving chip;
a display panel, comprising:
a display area; and
a fan-out region, arranged at a side of the display area, the fan-out region comprising a fan-out wire coupled to a bonding terminal and the bonding terminal arranged in the fan-out region;
wherein the display panel comprises a first metallic layer and a second metallic layer, the fan-out wire comprises a first fan-out wire and a second fan-out wire, in a first area, portions of the first fan-out wire comprise a first portion and a second portion;
wherein the first portion comprises one or more of a first coupling section and a second coupling section, a terminal of the first coupling section is coupled to a routing of the display area; a terminal of the second coupling section is coupled to the bonding terminal, and one or more of the first coupling section and the second coupling section are coupled to the second portion; and wherein a coupling of the first fan-out wire and the second fan-out wire and the bonding terminal are separated.

19. The display device according to claim 18, wherein a coupling portion of the first coupling section and the second coupling section is formed by the second metallic layer so that the second portion is coupled to the first coupling section and the second coupling section via a hole, respectively.

20. The display device according to claim 18, wherein an impedance of the first metallic layer is greater than the impedance of the second metallic layer, a width of one or more of the first fan-out wires arranged at the first area is less than a width of the first fan-out wire arranged at other areas, and a distance between the first fan-out wires in the first area is less than the distance between the first fan-out wires in the other areas.

* * * * *